United States Patent
Nogami et al.

(10) Patent No.: US 11,908,734 B2
(45) Date of Patent: Feb. 20, 2024

(54) COMPOSITE INTERCONNECT FORMATION USING GRAPHENE

(71) Applicant: International Business Machines Corporation, Armonk, NY (US)

(72) Inventors: Takeshi Nogami, Schenectady, NY (US); Son Nguyen, Schenectady, NY (US); Balasubramanian Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 17/450,118

(22) Filed: Oct. 6, 2021

(65) Prior Publication Data
US 2023/0106397 A1 Apr. 6, 2023

(51) Int. Cl.
*H01L 21/768* (2006.01)
*H01L 23/528* (2006.01)
*H01L 23/532* (2006.01)

(52) U.S. Cl.
CPC .. *H01L 21/76846* (2013.01); *H01L 21/76898* (2013.01); *H01L 23/5283* (2013.01); *H01L 23/53238* (2013.01); *H01L 23/53252* (2013.01); *H01L 23/53266* (2013.01); *H01L 23/53223* (2013.01)

(58) Field of Classification Search
CPC ............ H01L 21/768; H01L 21/76846; H01L 21/76898; H01L 23/528; H01L 23/532; H01L 23/5283; H01L 23/53238; H01L 23/53223; H01L 23/53252; H01L 23/53266; H01L 21/00; H01L 21/02;
(Continued)

(56) References Cited

U.S. PATENT DOCUMENTS 5,385,867 A 1/1995 Ueda et al.
8,358,008 B2 1/2013 Wada et al.
(Continued)

FOREIGN PATENT DOCUMENTS

CN 103956354 A 7/2014
CN 112151503 A 12/2020
WO 2017052572 A1 3/2017

OTHER PUBLICATIONS

Nogami et al., "Cobalt/Copper Composite Interconnects for Line Resistance Reduction in both Fine and Wide Lines," ITTC2017, 3 pgs.

*Primary Examiner* — Chuong A Luu
(74) *Attorney, Agent, or Firm* — Robert J. Shatto

(57) ABSTRACT

A semiconductor fabrication method that uses a graphene etch stop is disclosed. The method comprises forming a first set of trenches and a second set of trenches in a substrate. The first set of trenches are narrower than the second set of trenches. The method further comprises forming a graphene layer in the first and second sets of trenches. The method further comprises depositing a first conductor in the first and second sets of trenches. The method further comprises removing the first conductor from the second set of trenches using an etching process. The graphene layer acts as an etch stop for the etching process. The method further comprises depositing a second conductor in the second set of trenches. The second conductor is different than the first conductor.

7 Claims, 5 Drawing Sheets

(58) Field of Classification Search
CPC .......... H01L 21/02057; H01L 21/7685; H01L 21/76861; H01L 21/76871; H01L 21/76879
USPC ................................. 257/212, 774
See application file for complete search history.

(56) References Cited

U.S. PATENT DOCUMENTS

| | | |
|---|---|---|
| 8,476,765 B2 | 7/2013 | Zhang et al. |
| 9,293,412 B2 | 3/2016 | Bao et al. |
| 9,324,634 B2 | 4/2016 | Bao et al. |
| 9,818,644 B2 | 11/2017 | Yang et al. |
| 10,163,753 B2 | 12/2018 | Lee et al. |
| 10,535,559 B2 | 1/2020 | Yang et al. |
| 2012/0006580 A1* | 1/2012 | Sandhu ............. H01L 21/76865 977/734 |
| 2014/0021613 A1* | 1/2014 | Ryan ................. H01L 23/49866 257/E23.161 |
| 2014/0167268 A1 | 6/2014 | Bao et al. |

* cited by examiner

COMPOSITE INTERCONNECT FORMATION USING GRAPHENE

BACKGROUND

The present invention relates in general to semiconductor fabrication methods and resulting structures. More specifically, the present invention relates to forming semiconductor interconnects using a graphene etch stop and electron mobility enhancement to improve Cu resistance.

In an integrated circuit, interconnects are structures that connect two or more circuit elements together electrically. Lines are interconnect structures that provide electrical connection within a single layer, and vias are interconnect structures that provide electrical connection between layers in a physical electronic circuit.

SUMMARY

Embodiments of the present invention include fabrication methods and the corresponding structures. In some embodiments, the fabrication method comprises forming a first set of trenches and a second set of trenches in a substrate. The first set of trenches are narrower than the second set of trenches. The method further comprises forming a graphene layer in the first and second sets of trenches. The method further comprises depositing a first conductor in the first and second sets of trenches. The method further comprises removing the first conductor from the second set of trenches using an etching process. The graphene layer acts as an etch stop for the etching process. The method further comprises depositing a second conductor in the second set of trenches. The second conductor is different than the first conductor.

Additional embodiments are directed to a semiconductor structure. The semiconductor structure includes a substrate having a first set of lines formed therein. The first set of lines includes a first conductor material. The substrate further includes a second set of lines formed therein. The second set of lines have a width that is larger than the first set of lines. The second set of lines includes a second conductor material. The second set of lines are separated from the substrate by a graphene liner material.

Further embodiments are directed to another semiconductor structure. The semiconductor structure includes a metal interconnect. The semiconductor structure further includes a dielectric surrounding the metal interconnect. The semiconductor structure further includes a graphene layer located between the metal interconnect and the dielectric.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
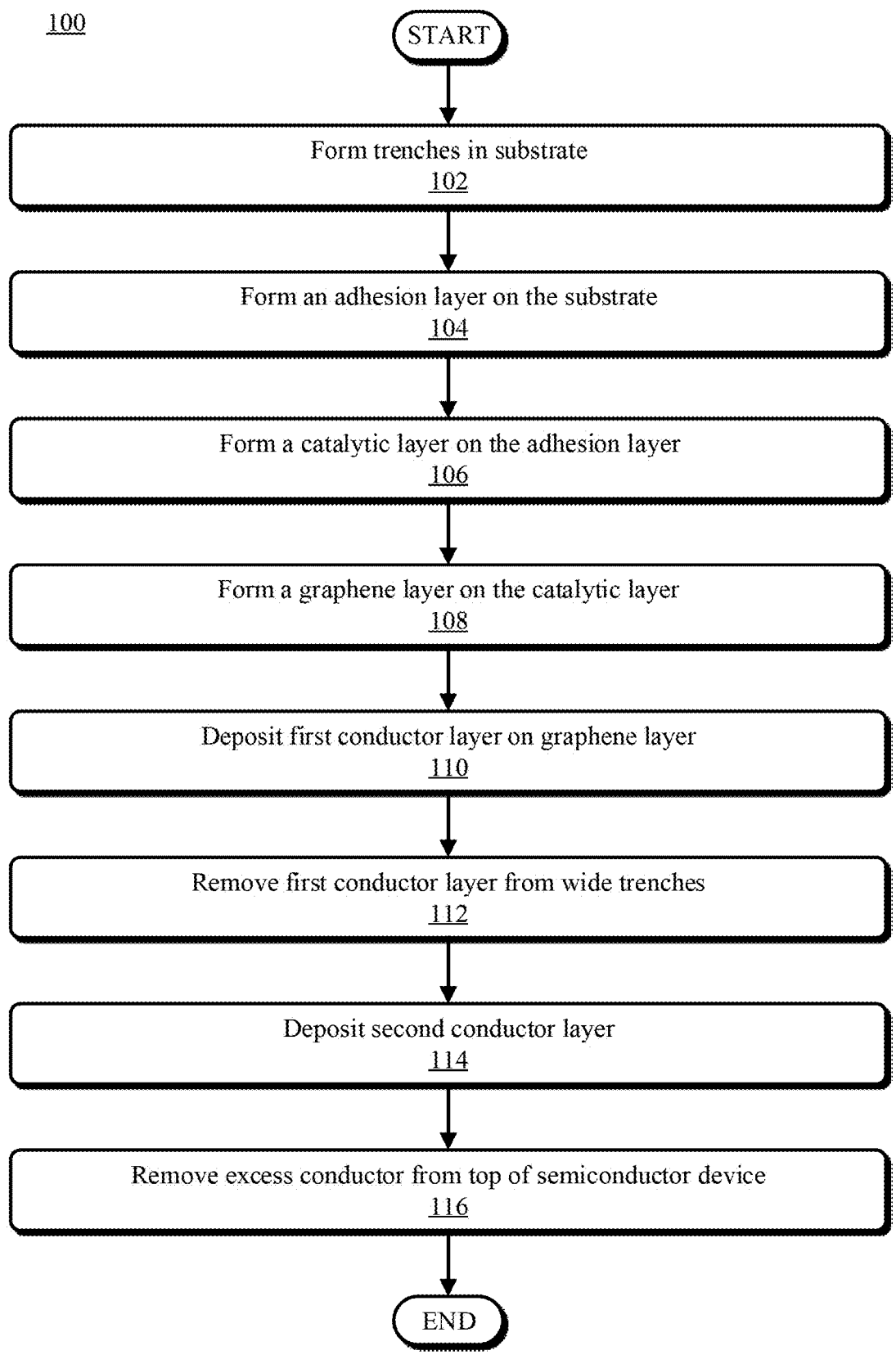
FIG. 1 illustrates a flowchart of an example method for forming a semiconductor component, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Embodiments of the present invention are generally directed to semiconductor fabrication methods and resulting structures, and more particularly to forming semiconductor interconnects using a graphene etch stop and metal conducting resistance reduction. While the present disclosure is not necessarily limited to such applications, various aspects of the disclosure may be appreciated through a discussion of various examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in integrated circuits, interconnects are structures that connect two or more circuit elements (such as transistors or power rails) together electrically. In addition to providing the electrical connection to the front end devices (such as transistors), interconnects also go all the way back to the power delivery networks. Thus, interconnects, and their surrounding support components, are often considered back-end-of-line (BEOL) components. Lines are interconnect structures that provide electrical connection within a single layer, and vias are interconnect structures that provide electrical connection between layers in a physical electronic circuit.

Fabrication processes can be used in different combinations and orders within the context of two main integration schemes for forming interconnect structures. A damascene flow refers to the processes of forming interconnect structures by depositing an oxide layer, forming a trench into the oxide layer, and then depositing metal into the trench. Alternatively, a subtractive flow refers to processes of forming interconnect structures by depositing metal, and then etching the metal to form the interconnect structures. Embodiments of the present disclosure employ a damascene flow process.

As semiconductor technology continues to be scaled down in size, practical limitations arise in terms of reliable fabrication processing. In order to overcome some of these practical limitations, modern integrated circuits may include interconnects with different sizes. For example, an integrated circuit may include "wide" lines and "narrow" lines. As used herein, "wide" and "narrow" refer to the width of the lines relative to each other. However, these terms do not imply any particular dimensions unless explicitly disclosed. The use of lines of different widths allows increased interconnect density (e.g., more narrow lines can be packed into a given surface area), while still allowing for wider lines where necessary (e.g., where narrow trenches line resistance would be too high for the application).

As the width (also referred to herein as the "size") of the lines decreases, the resistance of the lines increases. This is especially pronounced in some conductors, such as copper, which sees a very large increase in the resistance when the trenches are 12 nm or smaller. To address these concerns, composite metallization can be employed. Composite metallization is the process of creating narrow (also known as fine) lines with a first conductor (e.g., Co), while the wide lines utilize a different conductor (e.g., Cu). Typically, this process involves depositing the first conductor material, removing the first conductor from the wide lines, and then depositing the second, different conductor. However, removal of a conductor such as cobalt from trenches for wide lines is not controllable either by wet etching or by atomic layer etching because of the different sidewall thickness of the conductor among different trench width.

Embodiments of the present disclosure may address the above and other issues with current fabrication processes. Embodiments comprise forming a graphene layer on top of a conductor which works as a catalyst for graphene formation, such as Co and Ru. The graphene layer is then used as the wet etching stopping layer and provides low surface scattering of electrons during the subsequent composite metallization. As a result of the disclosed methods, the composite metallization may be formed with reduced line resistance for the wide lines. This is a result of the larger volume of the low resistivity conductor and the minimization of the surface scattering of the conductor that results from the interface of the graphene and the conductor.

It is to be understood that the aforementioned advantages are example advantages and should not be construed as limiting. Embodiments of the present disclosure can contain all, some, or none of the aforementioned advantages while remaining within the spirit and scope of the present disclosure.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description.

It should also be understood that material compounds will be described in terms of listed elements, e.g., SiN, SiCN, SiCO, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

Turning now to FIG. 1, illustrated is a flowchart of an example method 100 for forming a semiconductor structure having multiple interconnect sizes, in accordance with embodiments of the present disclosure. In some embodiments, the method 100 is a computer-implemented method. For example, the method 100 may be performed by a computer system (e.g., having a processor) controlling fabrication equipment. The method 100 begins at operation 101, wherein trenches are formed in a substrate.

In some embodiments, the substrate may be a semiconductor material, such as, for example, Si, Ge, GaAs, or any other suitable semiconductor. In some embodiments, the substrate may be a dielectric material, such as, for example, porcelain, mica, glass, or various metal oxides. The substrate may include one or more semiconductor devices that have previously been formed on the substrate. For example, embodiments of the present disclosure may be performed as a BEOL process after semiconductor devices (e.g., transistors) have been patterned and fabricated on the substrate (e.g., at the front-end-of-line (FEOL) step).

In some embodiments, operation 101 may include depositing an oxide layer and then forming a trench into the oxide layer. The trenches may be formed in a location on the substrate where corresponding lines will subsequently be formed. For example, the trenches may be formed between areas of the substrate where discrete semiconductor devices, such as transistors, may be formed. The trenches may correspond to BEOL lines use to connect the various semiconductor devices. The trenches formed at operation 102 may be formed using any suitable fabrication process. For example, the trenches may be formed by performing lithographic patterning (such as, for example, a tri-layer or quad-layer stack), and etching to selectively remove portions of the substrate to form the trenches.

Figure 2A:
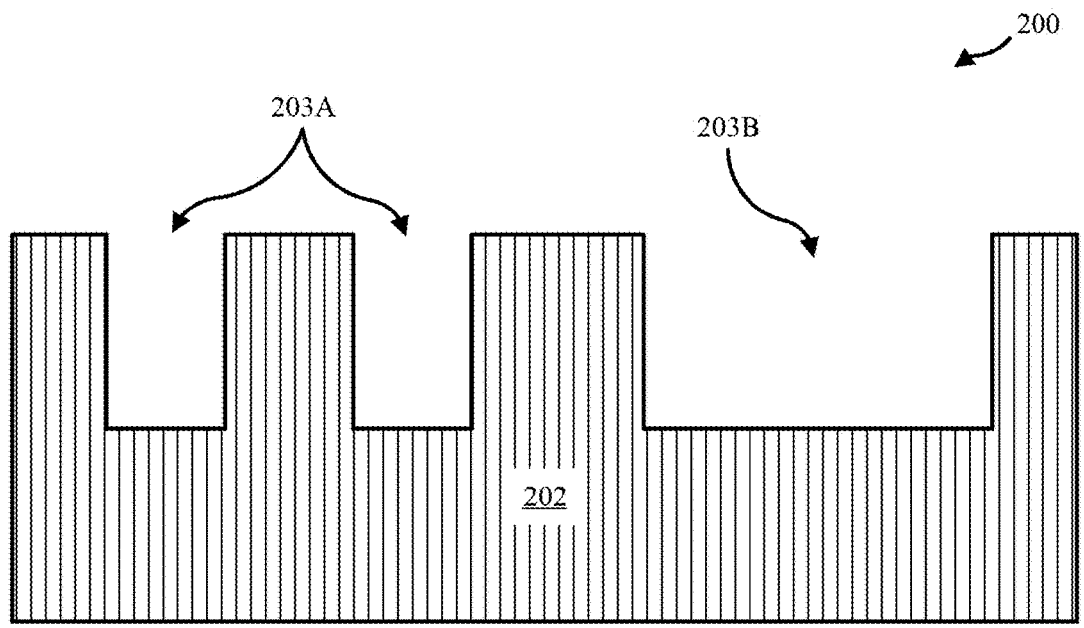
FIG. 2A illustrates an example of a semiconductor structure following the performance of a portion of the example method of FIG. 1, in accordance with embodiments of the present disclosure.

The resulting substrate may include a plurality of trenches and holes. The trenches may correspond to locations where lines will be formed, while the hold may be at locations where vias are to be formed. The trenches may have two or more different widths. In other words, the trenches formed in the substrate may have different dimensions, and in particular different widths. For example, the substrate may have a first set of trenches having a first width and a second set of trenches having a second width. The widths may be selected based on the purpose of the interconnect and the semiconductor devices connected thereby. An example semiconductor device following performance of operation 102 is shown in FIG. 2A.

At operation 104, and adhesion layer is formed on the substrate. The adhesion layer may be used to ensure that the conductor that will make up the bulk of the lines stick, or adhere, to the substrate. The adhesion layer may be any suitable material, depending on the conductor chosen for the lines. For example, and without limitation, the adhesion layer may be a thin film of tungsten, niobium, chrome, titanium, Ta, TaN, TiN. The thickness of the adhesion layer may be, for example, between approximately 5 Å and 400 Å.

Figure 2B:
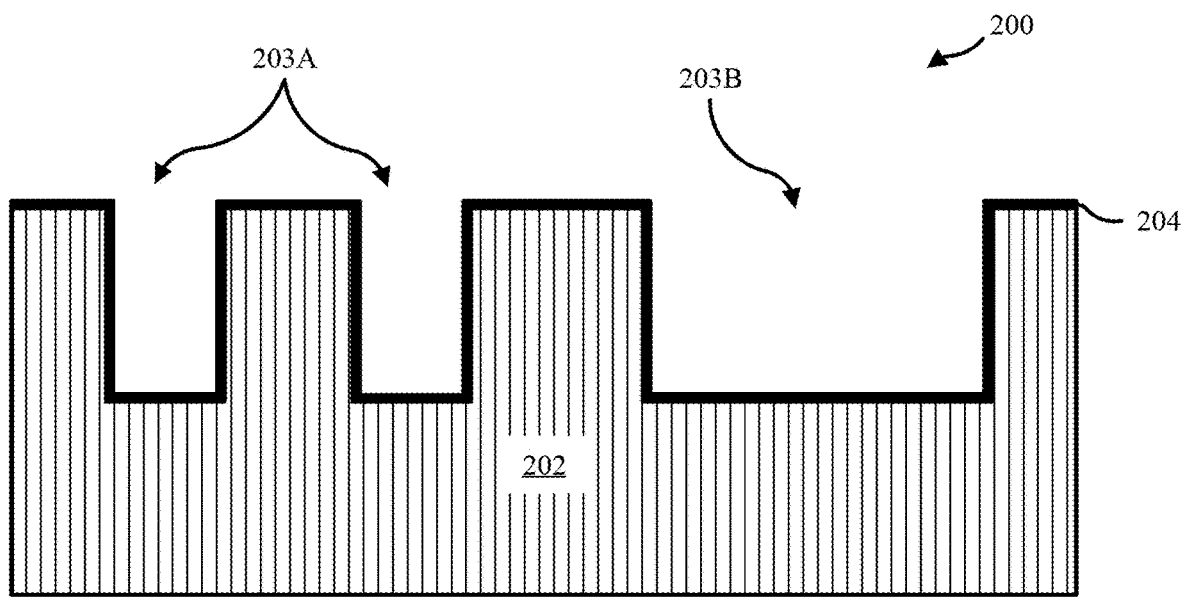
FIG. 2B illustrates an example of the semiconductor structure of FIG. 2A following the performance of additional fabrication operations, in accordance with embodiments of the present disclosure.

The adhesion layer may be formed using any suitable fabrication method. For example, the adhesion layer may be applied to the substrate using a physical vapor deposition (PVD) technique, such as a diffusion process or a sputter deposition process, among other suitable processes. An example semiconductor device following performance of operation 104 is shown in FIG. 2B.

Figure 2C:
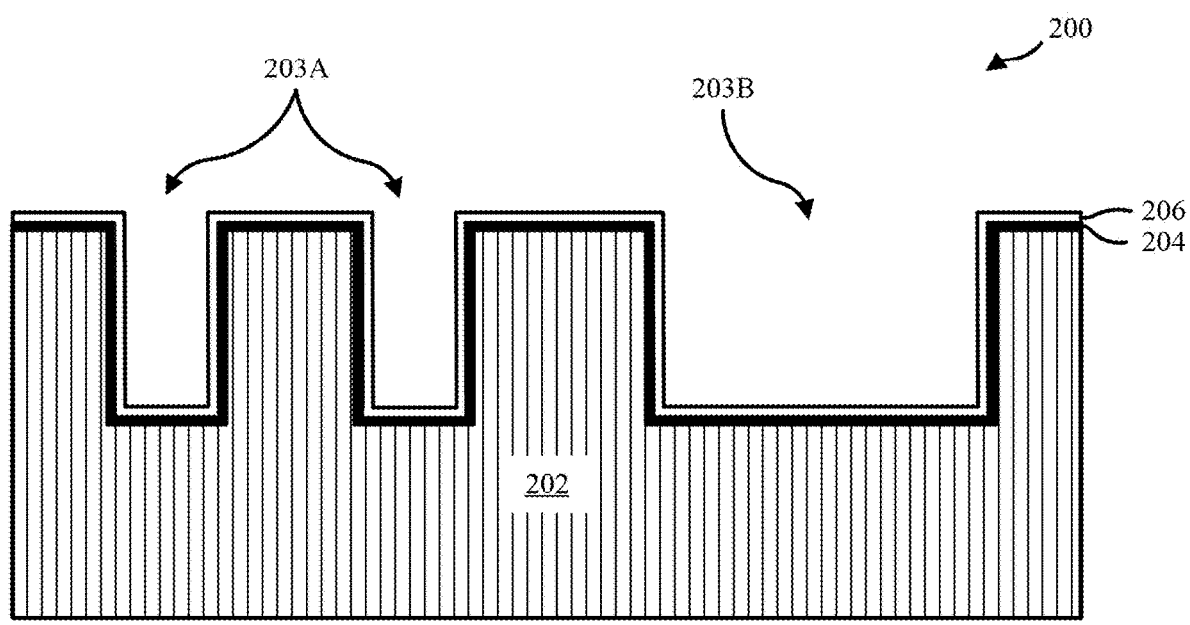
FIG. 2C illustrates an example of the semiconductor structure of FIG. 2B following the performance of additional fabrication operations, in accordance with embodiments of the present disclosure.

At operation 106, a catalytic layer is formed on the adhesion layer. The catalytic layer may be a material suitable for graphene formation. For example, the catalytic layer may be selected from Co, Ru, Ni, Pt, Ir, etc. However, other suitable materials (e.g., those having an empty d orbital) may also be used. The catalytic layer may be formed using any suitable fabrication process, such as a deposition technique. For example, the catalytic layer may be formed using PVD or CVD processes. An example semiconductor device following performance of operation 106 is shown in FIG. 2C.

Figure 2D:
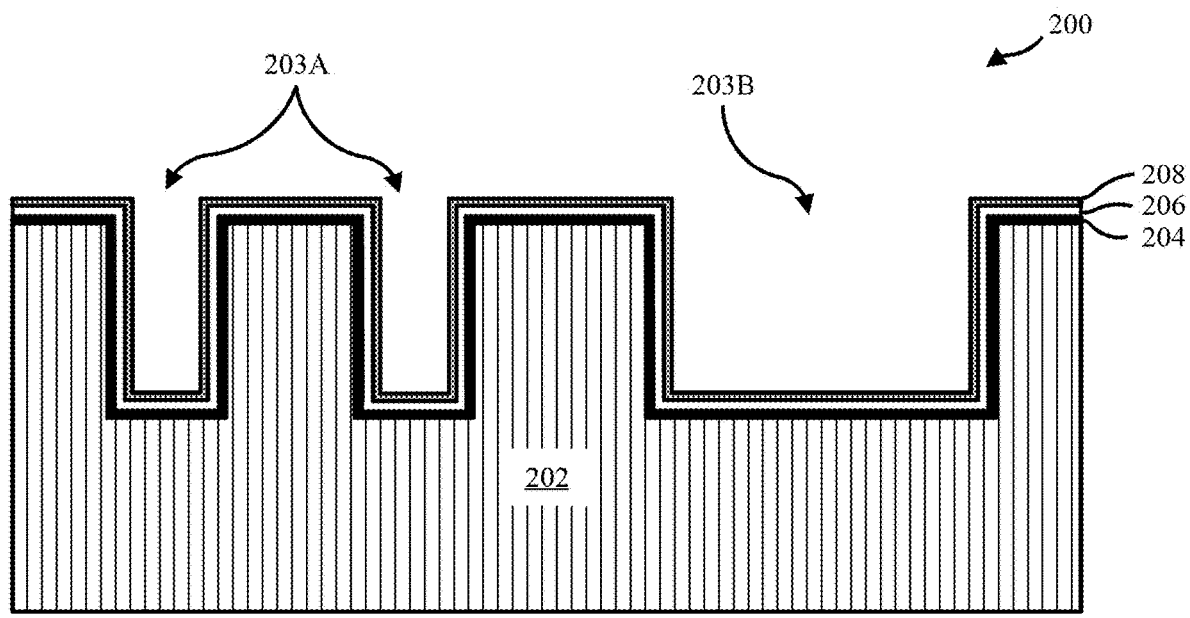
FIG. 2D illustrates an example of the semiconductor structure of FIG. 2C following the performance of additional fabrication operations, in accordance with embodiments of the present disclosure.

At operation 108, a graphene layer is formed on the catalytic layer. The graphene layer may be formed using any suitable fabrication process for depositing graphene, such as a deposition technique. For example, the catalytic layer may be formed using CVD processes. An example semiconductor device following performance of operation 108 is shown in FIG. 2D.

At operation 110, a first conductor layer is formed on the graphene layer. The first conductor layer is the conductor material that is intended to be used in the narrow lines. For example, the first conductor may be Co, Ru, or W. In some embodiments, the first conductor may be the same material that was used as the catalyst for the graphene. For example, the catalytic layer and the first conductor layer may both be Ru. In other embodiments, the first conductor may be a different material than the catalyst. For example, the catalytic layer can be Ru, and the first conductor layer can be Co. The materials of the catalytic layer and the first conductor layer may be selected according to a desired resistance of the narrow lines and/or convenience (e.g., using the same material for both may be more convenient).

The first conductor layer is formed such that it completely fills the narrow trenches and any vias. The first conductor layer may also sit atop the graphene in the regions between the trenches. However, the first conductor layer may only partially fill the wide trenches, which have a larger volume due to being the same depth but having a larger width than the narrow trenches.

Figure 2E:
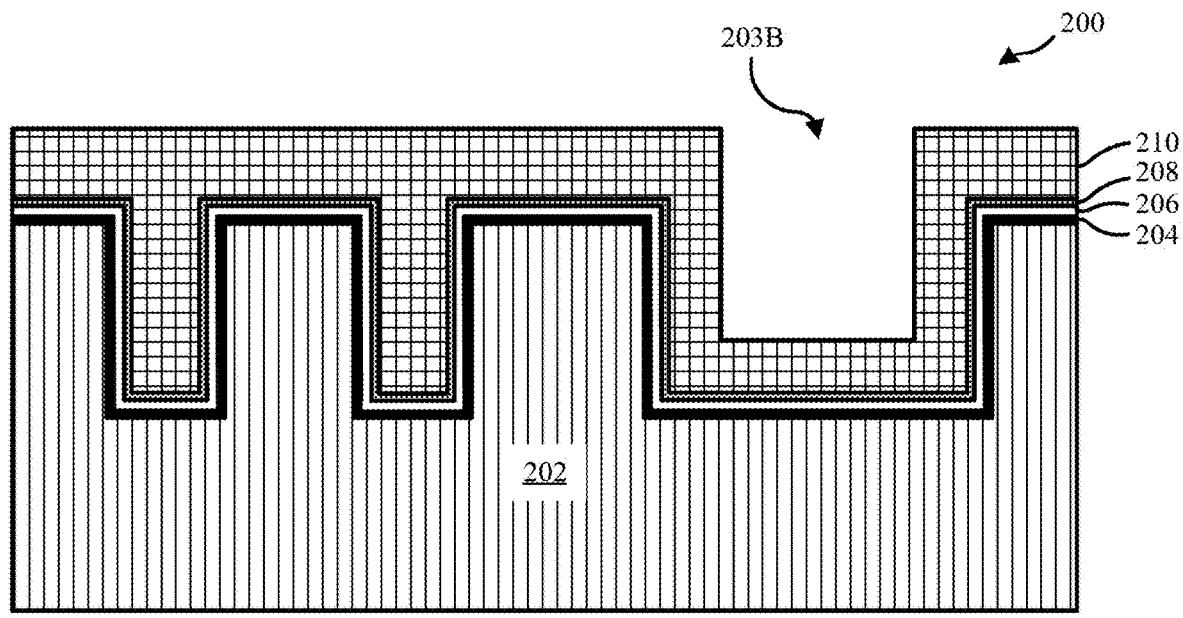
FIG. 2E illustrates an example of the semiconductor structure of FIG. 2D following the performance of additional fabrication operations, in accordance with embodiments of the present disclosure.

The first conductor layer may be formed using any suitable deposition technique, as would be known to a person of ordinary skill in the art. For example, the first conductor layer may be deposited using CVD processes. An example semiconductor device following performance of operation 110 is shown in FIG. 2E.

In some embodiments, a heat treatment may be performed. The heat treatment may help purify the first conductor and cause grain growth in the first conductor layer. It is to be understood, however, that the heat treatment operation is an optional operation, and some embodiments of the present disclosure may omit such a step.

At operation 112, the first conductor layer may be removed from the wide trenches. However, the first conductor layer will continue to fill the narrow trenches following performance of operation 112. In some embodiments, the first conductor can be removed from the wide trenches using a wet etching procedure. Any suitable wet etch chemical may be selected such that the graphene acts as an etch stop. In other words, a wet etch chemical that removes the first conductor but not the graphene (or only slowly removes the graphene), such as a phosphoric acid-based wet etch, may be used.

In other embodiments, plasma etching may be used. It is to be noted, however, that not all plasma etching techniques may be suitable. For example, fluorine plasma etching may be utilized because the graphene can act as an etch stop. However, other plasma etching techniques that do not stop at the graphene layer should be avoided.

In still other embodiments, an atomic layer etch (ALE) process may be used to remove the first conductor from the wide trenches, again using the graphene layer as an etch stop. Atomic layer etching is defined as a film etching technique that uses sequential self-limiting reactions. The concept is analogous to ALD, except that removal occurs in place of a second adsorption step, resulting in layer-by-layer material subtraction instead of addition. The simplest ALE implementation consists of two sequential steps: surface modification (reaction A) and removal (reaction B). Modification forms a thin reactive surface layer with a well-defined thickness that is subsequently more easily removed than the unmodified material. The layer is characterized by a sharp gradient in chemical composition and/or physical structure of the outermost layer of a material. The removal step takes away the modified layer while keeping the underlying substrate intact, thus "resetting" the surface to a pristine or near-pristine state for the next etching cycle. The total amount of material removed is determined by the repeated cycles.

Figure 2F:
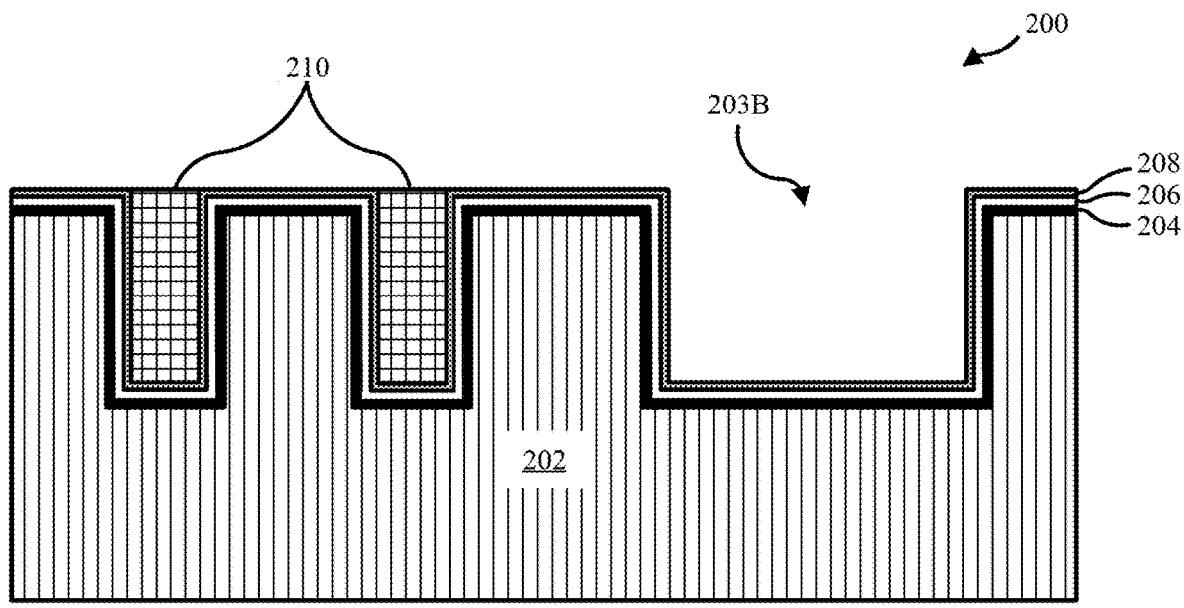
FIG. 2F illustrates an example of the semiconductor structure of FIG. 2E following the performance of additional fabrication operations, in accordance with embodiments of the present disclosure.

Removal of the excess first conductor may cause the first conductor in the narrow trenches to be substantially coplanar with the graphene layers that sit atop the semiconductor structure between trenches. However, this may be unnecessary in some embodiments as a planarization process at the end may remove a portion of the trenches (e.g., making them less deep). An example semiconductor device following performance of operation 112 is shown in FIG. 2F.

At operation 114, a second conductor layer is deposited. The second conductor layer may be deposited such that it fills the wide trenches and sits on top of the graphene layer. The process of depositing the second conductor layer may also result in the second conductor layer covering the first conductor in the narrow trenches. The second conductor layer is the conductor material that is intended to be used in the wide lines. For example, the second conductor may be W, Cu, Al, Ta, Co, Ru, Rh, or alloys thereof.

Figure 2G:
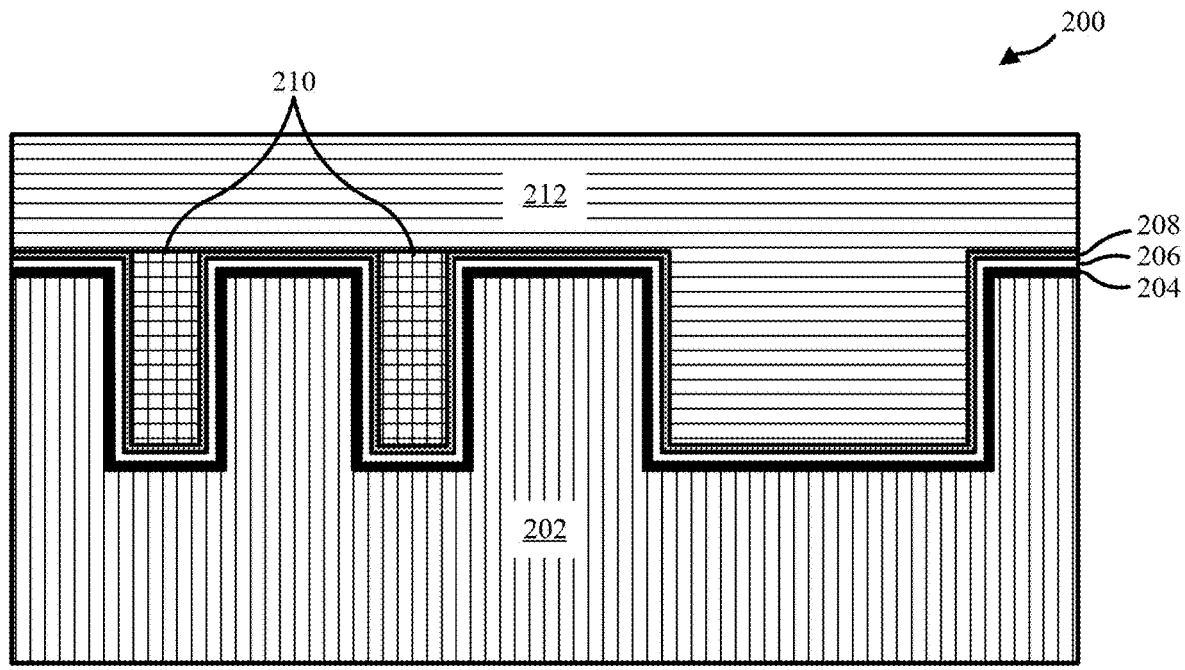
FIG. 2G illustrates an example of the semiconductor structure of FIG. 2F following the performance of additional fabrication operations, in accordance with embodiments of the present disclosure.

The second conductor layer may be formed using any suitable deposition technique, as would be known to a person of ordinary skill in the art. For example, the second conductor layer may be deposited using CVD processes. An example semiconductor device following performance of operation 114 is shown in FIG. 2G.

In some embodiments, a heat treatment may be performed. The heat treatment may help purify the second conductor and cause grain growth in the second conductor layer. It is to be understood, however, that the heat treatment operation is an optional operation, and some embodiments of the present disclosure may omit such a step.

Figure 2H:
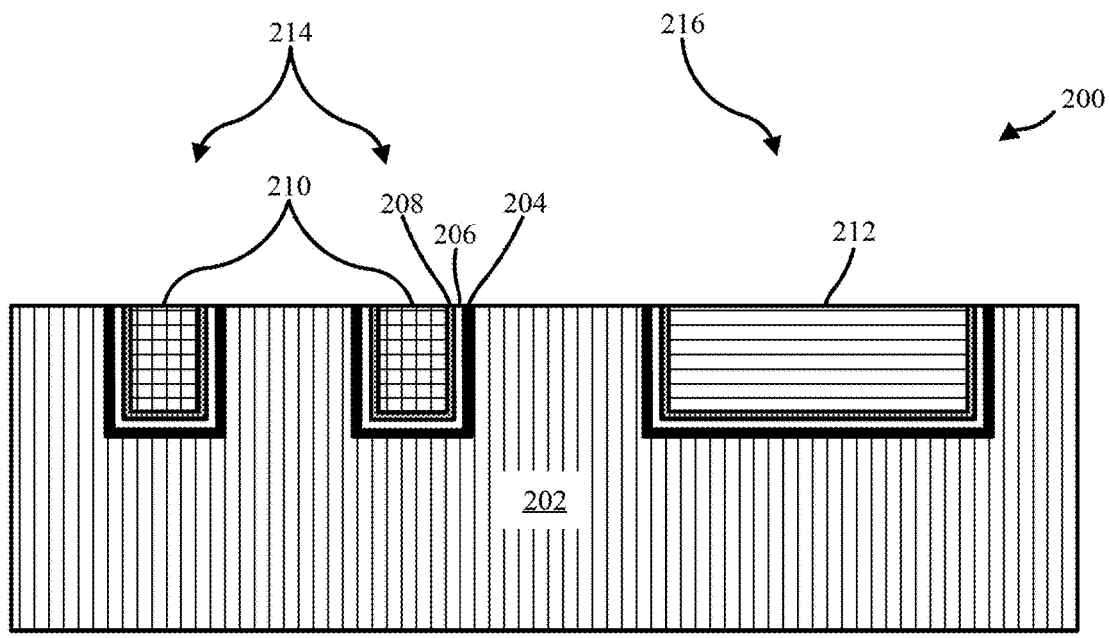
FIG. 2H illustrates an example of the semiconductor structure of FIG. 2G following the performance of additional fabrication operations, in accordance with embodiments of the present disclosure.

At operation 116, the excess conductor material may be removed from the top of the semiconductor device. For example, a CMP process may be used to remove the top layers of the semiconductor device, exposing the first conductor and the second conductor. The CMP may substantially planarize the structure such that the graphene layer no longer connects the lines, thereby electrically isolating them. An example semiconductor device following performance of operation 114 is shown in FIG. 2H.

After operation 116, the method 100 may end.

FIGS. 2A-2H illustrate is an example of a semiconductor device 200 during performance of the fabrication method 100. Referring first to FIG. 2A, shown is a substrate 202 after performance of operation 102. The substrate 202 has been etched using a photolithography operation to create a plurality of trenches in the substrate 202. In particular, the substrate 202 has been etched to create a pair of narrow trenches 203A and a wide trench 203B, collectively referred to herein as trenches 203.

Referring now to FIG. 2B, an adhesion layer 204 is deposited on the substrate 202. The adhesion layer may be deposited using PVD. The adhesion layer 204 may be, for example, TiN. As shown in FIG. 2B, the adhesion layer 204 may be deposited on the entire substrate. For example, the adhesion layer 204 may be deposited in the trenches 203, along the walls of the trenches 203, and on top of the semiconductor material that separates the trenches 203.

Referring now to FIG. 2C, a catalytic layer 206 is deposited on the adhesion layer 204. The catalytic layer 206 may be, for example, Ru. Like the adhesion layer 204, the catalytic layer 206 may be deposited in the trenches 203 such that it cover the bottom of the trenches 203 as well as the sidewalls of the trenches 203. The catalytic layer 206 may also be deposited on top of the separation structure that separates the trenches 203.

Referring now to FIG. 2D, a graphene layer 208 is formed on the catalytic layer 206. The graphene layer 208 may be deposited on the bottom of the trenches 203, on the sidewalls of the trenches 203, and on the separating structures between the trenches 203. The graphene layer 208 may be formed by CVD.

Referring now to FIG. 2E, a first conductor 210 is deposited on top of the graphene layer 208. As shown in FIG. 2E, the first conductor 210 may completely fill the narrow trenches 203A, thereby effectively creating narrow lines. Meanwhile, the first conductor 210 may only partially fill in the wide trenches 203B. The first conductor 210 may be formed using any suitable fabrication process, such as PVD.

Referring now to FIG. 2F, the first conductor 210 is removed from the wide trench 203B. As discussed herein, removal of the first conductor may be performed using wet etching or ALE. As shown in FIG. 2F, the removal of the first conductor 210 from the wide trench 203B may be done using the graphene layer 208 as an etch stop. Accordingly, the graphene layer 208 may remain in the wide trench 203B. Furthermore, the first conductor 210 may not be removed from the narrow trenches 203A.

Referring now to FIG. 2G, a second conductor 212 is deposited on top of the graphene layer 208 and the first conductor 210. As shown in FIG. 2E, the second conductor 212 may completely fill the wide trenches 203B, thereby effectively creating wide lines.

Referring now to FIG. 2H, a CMP process may be performed to planarize the top of the semiconductor device 200. As a result of the CMP process, the narrow lines 214 and the wide line 216 may be formed. Additionally, the CMP process may planarize the top of the semiconductor device 200 to a level below the initial height of the trenches 203. this may be done to ensure that the narrow lines 214 and wide lines 216 are all separated from each other. In other words, planarization may isolate the lines from each other such that they are no longer connected by the graphene layer 208, the catalytic layer 206, or the adhesion layer 204. This may be necessary to ensure that current does not flow from one line to another, such as would be the case if the graphene layer remains connected.

Accordingly, in some embodiments, graphene is formed on top of a catalytic metal layer (e.g., Co, Ru, Ni, Pt, Ir, etc.). The graphene may be formed by CVD. On top of the graphene layer, deposition of a first conductor, which fills trenches (and vias), is performed. A heat treatment for purification of the conductor and grain growth may optionally be performed. Removal of the first conductor out of wide trenches is made by either wet etching or ALE, where the graphene works as the etching stop layer. Finally, wide lines are filled with another conductor on top of the graphene layer.

As discussed herein, and as shown in FIGS. 2A-2H, the graphene layer acts as an etching stopper when a conductive material is removed from the wide lines. Furthermore, the graphene layer acts to reduce surface scattering of electrons in the wide lines, thereby improving the conductivity properties of the lines.

Furthermore, because graphene is a good electrical conductor, the graphene layer/liner itself works as part of the lines. Additionally, the catalytic layer, depending on the material selected, may also be a good electrical conductor, particularly at smaller dimensions, and may improve the characteristics of the lines by electron mobility enhancement. Accordingly, embodiments of the present disclosure can reduce the line resistance of the wide lines when compared to other composite metallization processes and structures.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure comprising:
   a substrate;
   a first set of lines formed in the substrate, wherein the first set of lines includes a first conductor material;
   a second set of lines formed in the substrate, the second set of lines having a width that is larger than the first set of lines, wherein the second set of lines includes a second conductor material,
   wherein the second set of lines are separated from the substrate by a graphene liner material, and wherein the first and second sets of lines are interconnects.

2. The semiconductor structure of claim 1, wherein the first set of lines are separated from the substrate by the graphene liner material.

3. The semiconductor structure of claim 1, further comprising:
    an adhesion layer in direct contact with the substrate; and
    a catalytic layer in direct contact with the adhesion layer opposite the substrate,
    wherein the adhesion layer is disposed between the substrate and the catalytic layer, and the catalytic layer is disposed between the adhesion layer and the graphene liner material.

4. The semiconductor structure of claim 3, wherein the adhesion layer has a thickness of between approximately 5 A and approximately 400 A.

5. The semiconductor structure of claim 3, wherein the catalytic layer is selected from the group consisting of Co, Ru, Ni, Pt, and Ir.

6. The semiconductor structure of claim 1, wherein the first conductor material is selected from the group consisting of Ru and Co, and wherein the second conductor material is selected from the group consisting of W, Cu, Al, Ta, and Rh.

7. The semiconductor structure of claim 1, wherein each line of the first and second sets of lines is electrically isolated from all other lines.

* * * * *